United States Patent
Cho

(10) Patent No.: US 6,596,629 B2
(45) Date of Patent: Jul. 22, 2003

(54) METHOD FOR FORMING WIRE IN SEMICONDUCTOR DEVICE

(75) Inventor: Young-a Cho, Chungju (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/116,941

(22) Filed: Apr. 5, 2002

(65) Prior Publication Data

US 2002/0177297 A1 Nov. 28, 2002

(30) Foreign Application Priority Data

Apr. 6, 2001 (KR) .................................. 2001-0018402

(51) Int. Cl.$^7$ .......................................... H01L 21/4763
(52) U.S. Cl. ..................... 438/648; 438/627; 438/629; 438/633; 438/643; 438/653; 438/658; 438/672; 438/675; 438/685
(58) Field of Search ................................ 438/627, 629, 438/633, 643, 648, 653, 658, 672, 675, 685

(56) References Cited

U.S. PATENT DOCUMENTS

| | | | |
|---|---|---|---|
| 5,863,835 A | 1/1999 | Yoo et al. | |
| 6,013,574 A | * 1/2000 | Hause et al. | 438/627 |
| 6,045,666 A | 4/2000 | Satitpunwaycha et al. | |
| 6,139,905 A | 10/2000 | Chen et al. | |
| 6,174,766 B1 | * 1/2001 | Hayashi et al. | 438/685 |
| 6,180,522 B1 | * 1/2001 | Hong | 438/653 |
| 6,376,355 B1 | * 4/2002 | Yoon et al. | 438/643 |
| 6,391,769 B1 | * 5/2002 | Lee et al. | 438/643 |

* cited by examiner

Primary Examiner—John F. Niebling
Assistant Examiner—Lynne Gurley
(74) Attorney, Agent, or Firm—Marshall, Gerstein & Borun

(57) ABSTRACT

A method for forming a wire in a semiconductor device, in forming a titanium film and a titanium nitride film as a barrier metal layer, which can deposit a titanium film and a titanium nitride film each in a different chamber by removing a titanium oxide film used as an insulating film made of upper titanium bonding with oxygen in air as the upper portion of a titanium film is exposed to air by a plasma process and then depositing a titanium nitride film, and as a result can reduce the throughput time of chamber equipment since the partial utilization of the system of the chamber equipment is enabled by driving another chamber even in case one of the chambers breaks down.

24 Claims, 3 Drawing Sheets

METHOD FOR FORMING WIRE IN SEMICONDUCTOR DEVICE

BACKGROUND

1. Technical Field

A method for forming a wire in a semiconductor device is disclosed. More particularly, a method for forming a wire in a semiconductor device is disclosed, wherein in forming a titanium film and a titanium nitride film as a barrier metal layer, a titanium film and a titanium nitride film are each deposited in different chambers by first removing a titanium oxide film that is used as an insulating film. The titanium oxide film is generated by allowing the upper titanium portion of the titanium film to bond with oxygen in air as the upper portion of a titanium film is exposed to air by a plasma process. A titanium nitride film is then deposited on the underlying non-oxidated titanium film. The disclosed methods reduce the throughput time of each chamber even in the case where one chamber breaks down.

2. Description of the Related Art

Generally, in the method for fabricating a semiconductor device, on condition that a metal wire serving as a conductive line between upper and lower portions is formed in a multi-layer, an inter-layer insulating film for insulating the multi-layer is widely used. A contact hole is formed by stacking a photoresist film on the upper part of the inter-layer insulating film to have a contact hole forming portion and etching the portion, and a metal wire is formed by immersing a metal layer into the contact hole.

Such a metal line is used as a bit line and a word line to electrically connect a gate electrode, a capacitor, etc. vertically and horizontally, for thereby constructing a semiconductor device.

FIG. 1 is a view illustrating a state in which a thermal treatment is conducted for a wire formed by a conventional method for forming a wire in a semiconductor device. As illustrated in FIG. 1, a conductive layer and a dielectric layer are sequentially formed on a semiconductor substrate having a predetermined substructure, and then a photoresist film is coated for forming a contact hole on an upper portion of the dielectric layer.

Then, the contact hole is formed in the dielectric layer by etching the dielectric layer using the photoresist film as a mask, and thereafter a barrier metal layer constructed as a double layer is formed by sequentially depositing titanium used as a first barrier metal layer and a titanium nitride film used as a second barrier metal layer on the dielectric layer on which the contact hole is formed.

At this time, after depositing the titanium used as the first barrier metal layer, the first and second barrier metal layers are sequentially and continuously deposited in ultra high vacuum in the event that the titanium is exposed to air in order to prevent the formation of a titanium oxide film used an insulating film on the titanium layer.

Continually, tungsten is deposited on the second barrier metal layer by using a chemical vapor deposition method, and thereafter a tungsten plug is formed by performing a chemical mechanical polishing process.

In the above-described conventional method for forming a wire in a semiconductor device, after depositing the titanium used as the first barrier metal layer, it is necessary to use cluster of equipment consisting of multi-chambers in ultra high vacuum continuously depositing the first and second barrier metal layers in the event that the titanium is exposed to air in order to prevent the formation of the titanium oxide film used as the insulating film on the titanium layer.

However, the cluster of equipment consisting of multi-chambers in ultra high vacuum is very expensive and the construction of the cluster of equipment is made complex due to the vacuum equipment. In addition, the cluster of equipment consisting of multi-chambers has a low throughput or high throughput time due to periodic breakdowns.

SUMMARY OF THE DISCLOSURE

Therefore, a method for forming a wire in a semiconductor device is disclosed, wherein, in forming a titanium film and a titanium nitride film as a barrier metal layer, the titanium film and a titanium nitride film are deposited in different chambers by removing a titanium oxide film used as an insulating film that is generated by an upper titanium portion of a titanium layer bonding with oxygen in air as the upper portion of the titanium film is exposed to air by a plasma process and then depositing a titanium nitride film on the underlying titanium film. The disclosed method can reduce the throughput time of chamber equipment since a partial utilization of the system of the chamber equipment is enabled by utilizing one chamber in case another chamber breaks down.

A disclosed method for forming a wire of a semiconductor device comprises: forming a portion for forming a contact hole by coating a photoresist film after depositing sequentially a conductive layer and a dielectric layer on a semiconductor substrate having a predetermined lower structure; forming a contact hole through a contact hole etching process by using the photoresist film as a mask; performing a heat process after depositing a first barrier metal layer on the entire surface of the dielectric layer formed the contact hole; depositing a second barrier metal layer after removing an insulation film formed on the upper portion of the first barrier metal layer by performing a plasma treatment process; forming a tungsten plug by performing a chemical mechanical polishing process after depositing tungsten on the second barrier metal layer.

Preferably, after removing an insulation layer on the first barrier metal layer by the plasma process, when depositing a second barrier metal layer on the first barrier metal removed the insulation layer, the second barrier metal layer is deposited to a thickness of about 50 Å by conducting the thermochemical vapor deposition process. Thereafter, the resistivity is reduced by removing the impurities in the second barrier metal layer by a plasma treatment.

Also, preferably, the second barrier metal layer is deposited to a desired deposition thickness by repeating the thermochemical vapor deposition process and the plasma treatment.

DETAILED DESCRIPTION OF THE PRESENTLY PREFERRED EMBODIMENTS

The disclosed methods will now be described with reference to the accompanying drawings.

FIGS. 2a through 2e are cross-sectional views sequentially illustrating a method for forming a wire in a semiconductor device.

Figure 1:
FIG. 1 illustrates a state in which a thermal treatment is conducted for a wire formed by a conventional method for forming a wire in a semiconductor device.
Figure 2A:
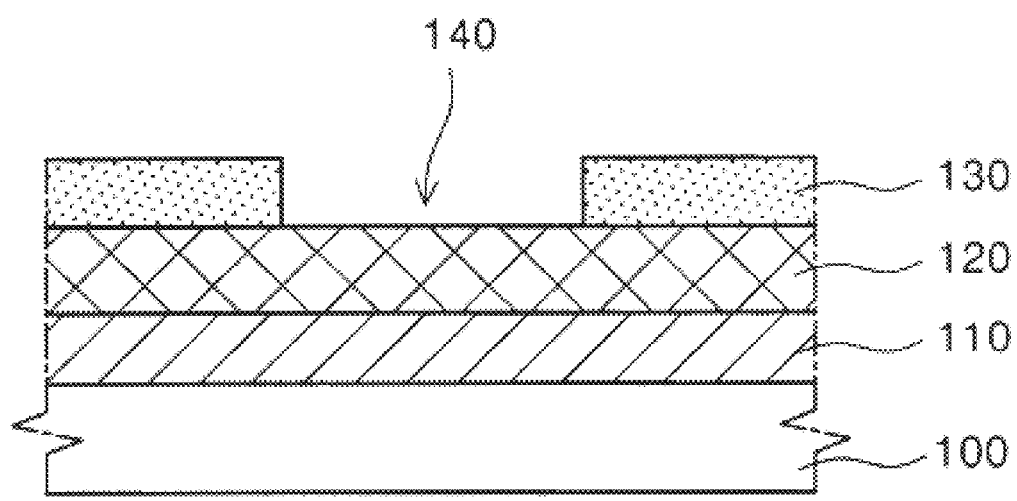
FIGS. 2a through 2e are cross-sectional views sequentially illustrating a disclosed method for forming a wire in a semiconductor device.

As illustrated in FIG. 2a, a conductive layer 110 and a dielectric layer 120 are sequentially deposited on a semiconductor substrate 100 having a predetermined lower substructure, and then a photoresist film 130 is coated thereon, for thereby forming a contact hole forming portion 140.

At this time, titanium (Ti) silicide or cobalt (Co) silicide is adapted as the conductive layer 110, and the silicide can be formed by a silicide method.

Figure 2B:
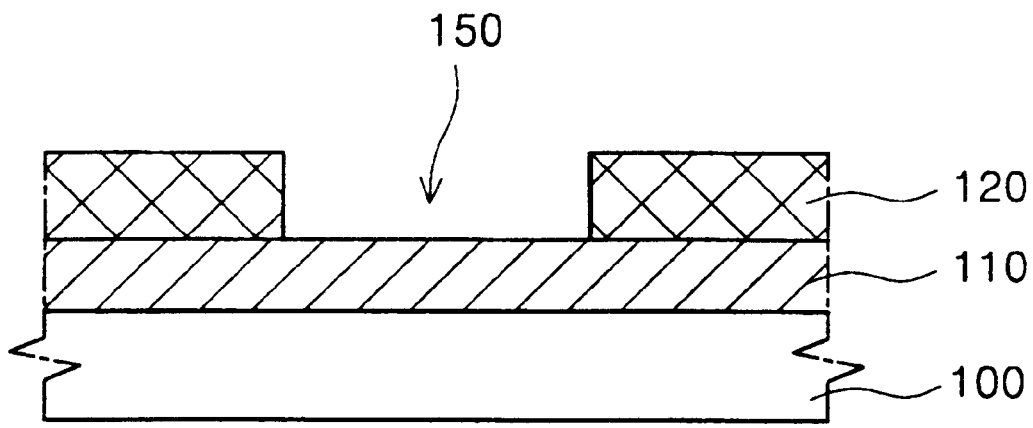

Continuously, as illustrated in FIG. 2b, a contact hole 150 is formed in the dielectric layer 120 by performing an etching process for etching the dielectric layer 120 up to the upper part of the lower conductive layer 110 using the photoresist film 130 as a mask.

Figure 2C:
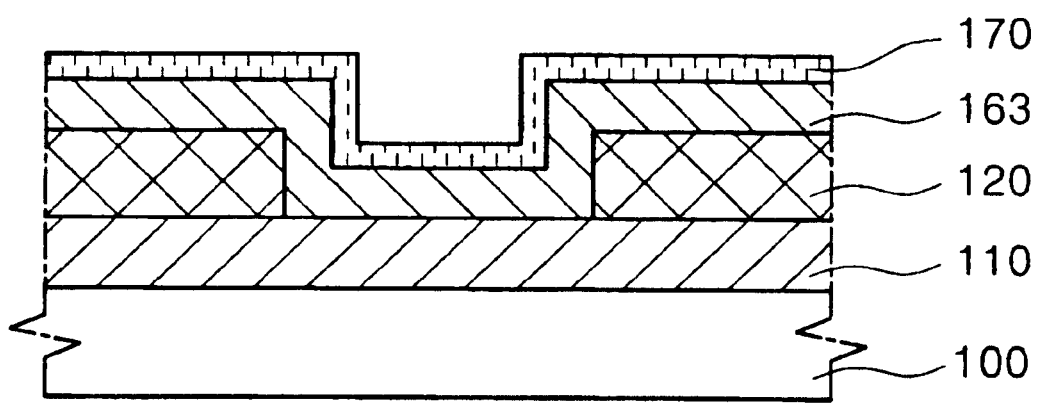

Then, as illustrated in FIG. 2c, titanium is deposited as a first barrier metal layer 163 on the entire upper part of the dielectric layer 120 on which the contact hole 150 is formed, and thereafter the deposition state of the titanium is made uniform by performing a thermal process.

Continuously, in the successive process, the semiconductor substrate on which the first barrier metal layer 163 deposited is moved to another chamber in order to deposit a second barrier metal layer.

At this time, the upper portion of the titanium film used as the first barrier metal layer 163 is exposed to air, and thus a titanium oxide film used as an insulating film 170 is formed on the titanium film by a bonding reaction between the upper portion of the exposed titanium film and oxygen in air.

However, if the insulating film 170 exists between the first barrier metal layer 163 and the second barrier metal layer, a contact resistance is increased. Thus, it is necessary to remove the insulting film 170.

Figure 2D:
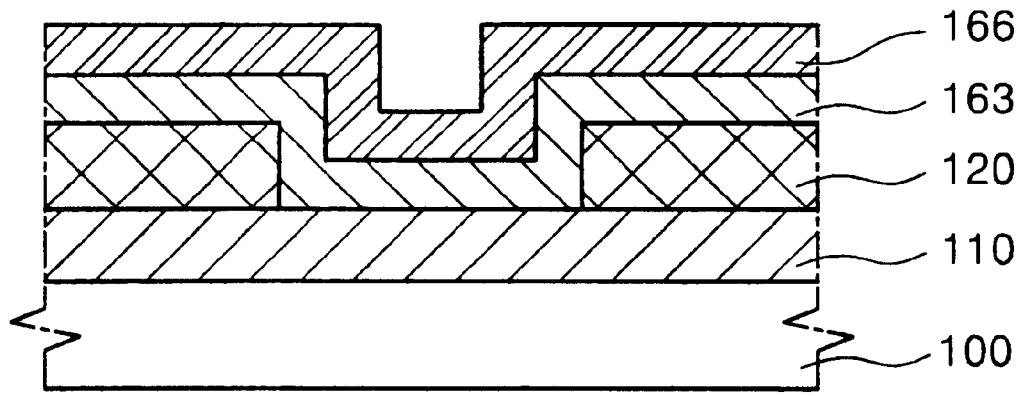

Then, as illustrated in FIG. 2d, the titanium oxide film used as the insulating film 170 formed on the upper portion of the first barrier metal layer 163 is removed by plasma treatment, and thereafter a titanium nitride film is deposited as the second barrier metal layer 166 in the same chamber.

In the plasma treatment, plasma is at least one of $N_2$, $H_2$, $N_2/H_2$, $N_2/H_2/He$ and $N_2/H_2/Ar$ gases. The $N_2$, $H_2$, He and Ar gases are supplied in a flow rate ranging from about 0 to about 2 slm.

In addition, the plasma treatment is conducted for a time period ranging from about ten seconds to about ten minutes with a pressure ranging from about 0.1 to about 100 Torr at a temperature ranging from about 300 to about 800° C. with a power ranging from about 100W to about 5 kW.

At this time, the plasma treatment process for removing the insulating film 170 and the deposition of the second barrier metal layer 166 are conducted in the same chamber. The titanium oxide film used as the insulating film 170 is removed by plasma in a reaction such as the following Reaction Formula 1.

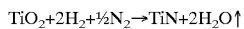

$$TiO_2 + 2H_2 + \tfrac{1}{2}N_2 \rightarrow TiN + 2H_2O\uparrow$$

Here, the titanium nitride film used as the second barrier metal layer 166 is deposited by a thermochemical vapor deposition method by using Tetra(DiMethylAmine) Titanium and $Ti((CH_3)_2N)_4$ as raw gas. Thus, the second barrier metal layer 166 has a high resistivity because it contains a large amount of C, O, etc.

Therefore, after stacking the second barrier metal layer 166 by the thermochemical vapor deposition method, it is necessary to reduce the resistivity by removing impurities in the second barrier metal layer 166 by conducting a plasma treatment in the same chamber. At this time, in the above plasma treatment, it is possible to remove only impurities with a depth of about 50 Å from the surface of the second barrier metal layer 166 deposited by the thermochemical vapor deposition method.

Hence, the second barrier metal layer 166 is deposited to a thickness ranging from about 30 to about 70 Å, preferably, to a thickness of 50 Å, by conducting the thermochemical vapor deposition process. Thereafter, the resistivity is reduced by removing the impurities in the second barrier metal layer 166 by the plasma treatment. Then, the second barrier metal layer 166 is deposited to a desired deposition thickness by repeating the thermochemical vapor deposition process and the plasma treatment in the manner that the second barrier metal layer 166 is deposited to a thickness of about 50 Å by conducting the thermochemical vapor deposition process and the plasma treatment and then removing the impurities in the deposited second barrier metal layer 166.

At this time, in the plasma treatment, plasma is at least one of $N_2$, $H_2$, $N_2/H_2$, $N_2/H_2/He$ and $N_2/H_2/Ar$ gases. The $N_2$, $H_2$, He and Ar gases are supplied at a flow rate ranging from about 0 to about 2 slm.

In addition, the plasma treatment is conducted for a time period ranging from about ten seconds to about ten minutes with a pressure ranging from about 0.1 to about 100 Torr at a temperature ranging from about 300 to about 800° C. with a power ranging from about 100W to about 5 kW.

Figure 2E:
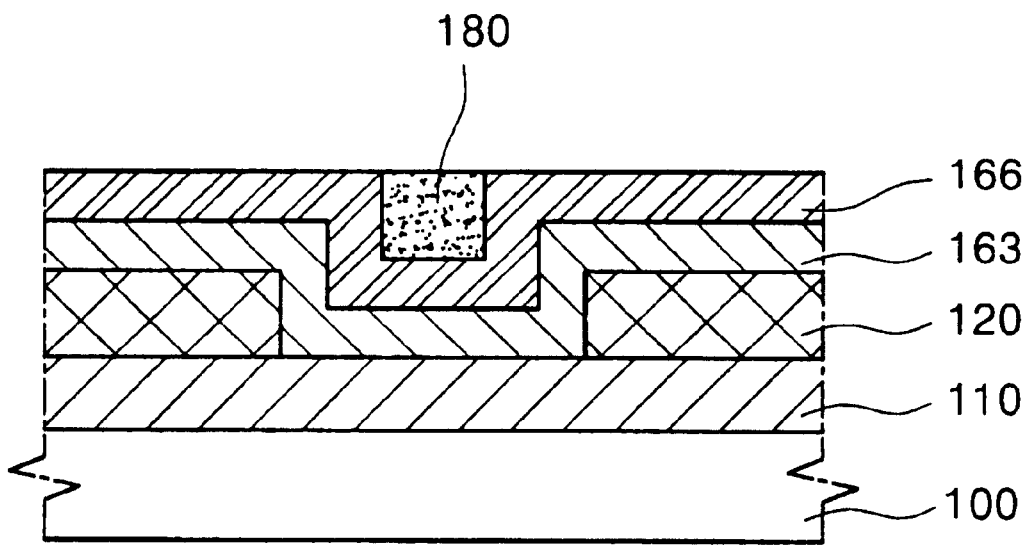

Continuously, as illustrated in FIG. 2e, the contact hole 150 is buried by depositing tungsten on the second barrier metal layer 166 by a chemical vapor deposition method, and then a tungsten plug 180 is formed by conducting a chemical mechanical polishing (CMP) process or a reactive ion etch (RIE) process.

Accordingly, as described above, in the disclosed method for forming a wire in a semiconductor device, in forming a titanium film and a titanium nitride film as a barrier metal layer, a titanium film and a titanium nitride film each can be deposited in a different chamber by first removing a titanium oxide film used as an insulating film that is made by an upper titanium portion bonding with oxygen in air as the upper portion of the titanium film is exposed to air by a plasma process and then depositing a titanium nitride film. As a result, the throughput time of the chamber equipment can be reduced since the partial utilization of the system of the chamber equipment is enabled by using another chamber in case one of the chambers breaks down.

As the disclosed methods may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meeting point and bounds of the claims, or equivalencies of such meets and bounds are therefore intended to be embraced by the appended claims.

What is claimed is:

1. A method for forming a wire of a semiconductor device, the method comprising:

depositing sequentially a conductive layer and a dielectric layer on a semiconductor substrate;

coating a photoresist film on the dielectric layer;

forming a contact hole in the photoresist film;

forming a partial contact hole in the dielectric layer by an etching process using the photoresist film as a mask and removing the photoresist film;

depositing a first barrier metal layer on the entire surface of the dielectric layer and contact hole formed therein;

depositing a second barrier metal layer after removing an insulation film formed on the upper portion of the first barrier metal layer by performing a plasma treatment process;

forming a tungsten plug by performing a chemical mechanical polishing process after depositing tungsten on the second barrier metal layer.

2. The method of claim 1, wherein the conductive layer is deposited using titanium silicide or cobalt silicide.

3. The method of claim 1, wherein the first barrier layer comprised titanium.

4. The method of claim 1, wherein, in the plasma treatment process, the plasma is formed by using at least one material selected from the group consisting of $N_2$, $H_2$, $N_2/H_2$, $N_2/H_2/He$ and $N_2/H_2/Ar$.

5. The method of claim 4, wherein the $N_2$, $H_2$, He and Ar gases are supplied at a flow rate ranging from about 0 to about 2 slm.

6. The method of claim 1, wherein the plasma treatment processing is performed at a power ranging from about 100W to about 5 KW, a temperature ranging from about 300 to about 800° C., a pressure ranging from about 0.1 to about 100 Torr over a time period ranging from about 10 seconds to about 10 minutes.

7. The method of claim 1, wherein the second barrier metal layer comprises titanium nitride film by using Tetra (dimethylamine) Titanium and $Ti((CH_3)_2N)_4$ gases as source gases.

8. The method of claim 1, wherein the second barrier metal layer is deposited with a desired thickness by performing repeatedly a thermochemical vapor deposition process and the plasma treatment process.

9. The method of claim 7, wherein the second barrier metal layer is formed with a thickness ranging from about 30 to about 70 Å with a chemical vapor deposition process.

10. The method of claim 8, wherein in the plasma treatment process, the plasma is formed by using at least one material selected from the group consisting of $N_2$, $H_2$, $N_2/H_2$, $N_2/H_2/He$ and $N_2/H_2/Ar$.

11. The method of claim 10, wherein the $N_2$, $H_2$, He and Ar gases are supplied at a flow rate ranging from about 0 to about 2 slm.

12. The method of claim 8, wherein the plasma treatment processing is performed at a power ranging from about 100W to about 5 KW, a temperature ranging from about 300 to about 800° C., a pressure ranging from about 0.1 to about 100 Torr over a time period ranging from about 10 seconds to about 10 minutes.

13. A method for forming a wire of a semiconductor device, the method comprising:

depositing sequentially a conductive layer and a dielectric layer on a semiconductor substrate;

coating a photoresist film on the dielectric layer;

forming a partial contact hole in the photoresist film;

forming a contact hole in the dielectric layer using an etching process using the photoresist film as a mask and removing the photoresist film;

depositing a first barrier metal layer on the entire surface of the dielectric layer and the contact hole formed therein;

depositing a second barrier metal layer after removing an insulation film formed on the upper portion of the first barrier metal layer by performing a plasma treatment process;

performing a heat process to the second barrier metal layer; and forming a tungsten plug by performing a chemical mechanical polishing process after depositing tungsten on the second barrier metal layer.

14. The method of claim 13, wherein the conductive layer is deposited by using titanium silicide or cobalt silicide.

15. The method of claim 13, wherein the first barrier layer comprises titanium.

16. The method of claim 13, wherein in the plasma treatment process, the plasma is formed by using at least one material selected from the group consisting of $N_2$, $H_2$, $N_2/H_2$, $N_2/H_2/He$ and $N_2/H_2/Ar$.

17. The method of claim 16, wherein the N2, H2, He and Ar gases are supplied at a flow rate ranging from about 0 to about 2 slm.

18. The method of claim 13, wherein the plasma treatment processing is performed at a power ranging from about 100W to about 5 KW, a temperature ranging from about 300 to about 800° C., a pressure ranging from about 0.1 to about 100 Torr over a time period ranging from about 10 seconds to about 10 minutes.

19. The method of claim 13, wherein the second barrier metal layer comprises titanium nitride film by using Tetra (dimethylamine) Titanium and $Ti((CH_3)_2N)_4$ gases as source gases.

20. The method of claim 13, wherein the second barrier metal layer is deposited with a desired thickness by performing repeatedly a thermochemical vapor deposition process and the plasma treatment process.

21. The method of claim 19, wherein the second barrier metal layer is formed with a thickness ranging from about 30 to about 70 Å with a chemical vapor deposition process.

22. The method of claim 20, wherein in the plasma treatment process, the plasma is formed by using at least one material selected from the group consisting of $N_2$, $H_2$, $N_2/H_2$, $N_2/H_2/He$ and $N_2/H_2/Ar$.

23. The method of claim 22, wherein the $N_2$, $H_2$, He and Ar gases are supplied at a flow rate ranging from about 0 to about 2 slm.

24. The method of claim 20, wherein the plasma treatment processing is performed at a power ranging from about 100W to about 5 KW, a temperature ranging from about 300 to about 800° C., a pressure ranging from about 0.1 to about 100 Torr over a time period ranging from about 10 seconds to about 10 minutes.

* * * * *